United States Patent [19]

Higgins et al.

[11] 3,806,915

[45] Apr. 23, 1974

[54] MULTITHRESHOLD ANALOG TO DIGITAL CONVERTER

[75] Inventors: Roger K. Higgins, Silver Spring, Md.; Lee M. Spetner, Rehovot, Israel

[73] Assignee: The United States of America as represented by the Secretary of the Navy, Washington, D.C.

[22] Filed: Sept. 5, 1972

[21] Appl. No.: 286,381

[52] U.S. Cl. .......... 340/347 AD, 307/235

[51] Int. Cl. .......... H03k 13/175

[58] Field of Search .......... 340/347 AD; 307/235

[56] References Cited

UNITED STATES PATENTS

| | | | |
|---|---|---|---|
| 2,922,151 | 1/1960 | Reiling | 340/347 AD |
| 3,216,005 | 11/1965 | Hoffman et al. | 340/347 AD |
| 3,537,101 | 10/1970 | Campanella et al. | 340/347 AD |
| 3,573,798 | 4/1971 | Reiling | 340/347 AD |
| 3,225,347 | 12/1965 | Doyle | 340/347 AD |
| 3,493,958 | 2/1970 | Gorbatenko et al. | 340/347 AD |
| 3,644,924 | 2/1972 | Kitaguchi et al. | 340/347 AD |
| 3,653,029 | 3/1972 | Kuhlmann | 340/347 AD |
| 3,539,831 | 11/1970 | Gilbert | 307/235 |
| 2,894,214 | 7/1959 | Touraton | 340/347 AD X |
| 3,518,663 | 6/1970 | Oddo et al. | 340/347 P |

OTHER PUBLICATIONS

"IBM Technical Disclosure Bulletin," Aldrich et al., Vol. 9, No. 8, Jan. 1967, pp. 1054–1056.

"IBM Technical Disclosure Bulletin," Woodman, Vol. 9, No. 12, May 1967, pp. 1797–1798.

*Primary Examiner*—Charles D. Miller

[57] ABSTRACT

A method and apparatus for performing high speed conversion of an analog signal into a binary digital code. The analog input signal is applied simultaneously to a plurality of threshold detectors each associated with a preselected different discrete analog signal level and whose output signals are combined according to a novel logic algorithm to produce the multi-bit digital binary output Gray code or straight binary code with a minimum of time consuming serially connected circuit operations or elements.

2 Claims, 7 Drawing Figures

MULTITHRESHOLD ANALOG TO DIGITAL CONVERTER

BACKGROUND OF THE INVENTION

Various methods and apparatus have been proposed previously for converting an input analog signal into a corresponding digital output code. However, most of the prior art analog-to-digital code converters suffer from various deficiencies which make them unsuitable particularly for high speed analog-to-digital conversion applications. This limitation on the speed at which analog-to-digital conversion can be accomplished by the previously proposed converters is in large part due to the relatively large number of serially connected circuit elements which the converters utilize. Moreover, many of the previously proposed analog-to-digital converters suffer from the presence of so-called circuitry hysteresis; i.e., circuit response in detecting a particular level of the analog input signal depends upon the direction from which that threshold level is approached by the analog input signal. In addition, it is also desirable that the output binary digital code be in a form which can readily be manipulated mathematically; e.g., a multi-line output code from the converter is preferable to a single-line output.

SUMMARY OF THE INVENTION

The proposed analog-to-digital conversion method and apparatus of the present invention makes use of a plurality of parallel threshold detector circuits which simultaneously compare the analog input voltage against multiple voltage levels as determined by different values of threshold bias applied to the detector circuits. By way of example, for an $n$-bit output code, there are $2^n - 1$ discrete levels of the analog input signal to be detected. The output signals produced by the level detectors are interconnected, through logical AND and OR gating circuitry, in a novel manner which permits direct and rapid conversion into the desired multiple-line, digital binary Gray or straight binary code output. The circuitry employed is specifically designed so that a minimum of serially connected circuit operations or elements are required in the conversion process; thereby reducing significantly the amount of time required for the conversion process.

In view of the above, one object of the present invention is to provide a novel method and apparatus for performing high speed analog-to-digital code conversion.

Another object of the present invention is to provide a method and apparatus for performing high speed conversion of an analog input signal into an output digital binary Gray or straight binary code.

A further object of the present invention is to provide a method and apparatus for performing analog-to-binary digital code conversion wherein the analog signal is applied simultaneously to a plurality of level detectors each associated with a discrete level of the analog input signal to be detected and whose output signals are combined according to a novel logical pattern or algorithm in order to derive the desired output digital code in a minimum amount of time.

A further object of the present invention is to provide a method and apparatus for converting an analog input voltage signal into a multiple-bit binary digital code with a minimum amount of converter circuitry.

Other objects, purposes and characteristic features of the present invention will in part be pointed out as the description of the present invention progresses and in part be obvious from the accompanying drawings wherein.

Figure 1:
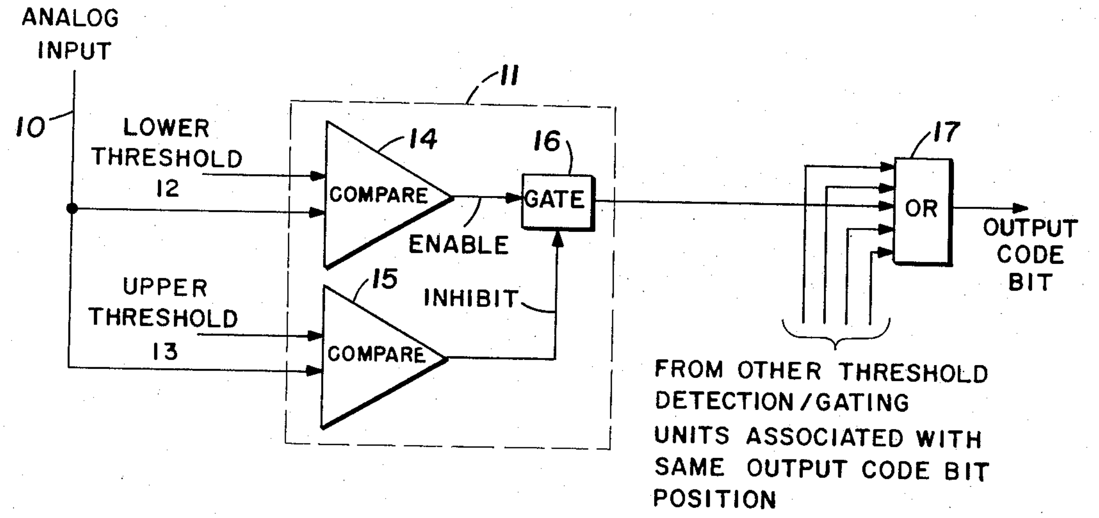
FIG. 1 is a simplified block diagram illustrating threshold detector/logic circuitry embodying the proposed analog-to-digital conversion method and apparatus of the present invention.

In accordance with the present invention, the analog input signal to be digitized is applied simultaneously as input to a plurality of threshold or comparator circuits each associated with a different predetermined analog threshold level. Thus, if conversion to an $n$-bit binary digital code output is desired, there would then be $2^n - 1$ threshold detector circuits, each associated with a different discrete analog input signal voltage level. The level detector circuits function in pairs to produce an output signal indicating the amplitude of the analog input signal relative to the discrete signal level values assigned thereto; e.g., the detector circuit pair produces a first output signal level whenever the analog signal is below the lower associated threshold, produces a second output signal level whenever the analog signal exceeds this threshold, and again produces the first output signal level whenever the analog signal is above the upper associated threshold. The output signals from the level detectors are then combined, according to a novel logical algorithm to be described in more detail hereinafter, so as to produce within a minimum conversion time binary output bits in the various $2^0, 2^1, 2^2 \ldots 2^n$ bit positions to form the corresponding digital code representation of the analog input.

More specifically, in the analog-to-binary Gray code embodiment of the present invention, the output signals from the threshold detector circuits are combined to produce binary Gray code output bits in accordance with the following logical pattern or algorithm:

a. a binary output bit is produced in the $2^0$ bit position whenever the analog input signal amplitude is greater than any level $4N - 3$ and less than the next higher level $4N - 1$;

b. a binary output bit is produced in the $2^1$ bit position whenever the analog input signal is greater than any level $2(4N - 3)$ and less than the next higher level $2(4N - 1)$;

c. a binary output bit is produced in the $2^2$ bit position whenever the analog input signal is greater than any level 4 (4N − 3) and less than the next higher level 4 (4N − 1); and, d. a binary output bit is produced in the $2^n$ bit position whenever the analog input signal is greater than any level $2^n$ (4N − 3) and less than the next higher level $2^n$ (4N − 3), where N is an increasing integer used to designate the output from a pair of threshold detectors when the analog input signal is between the two thresholds; e.g., the first output (N = 1) of the $2^1$ bit position occurs whenever the analog input signal is greater than threshold 2, determined from 2 (4N − 3), and less than threshold 6, determined from 2 (4N − 1). In a similar fashion the second output (N = 2) occurs whenever the analog input signal is greater than threshold 10 and less than threshold 14. Stated in more general terms, a binary Gray code output bit is produced in the $2^x$ bit position when the analog input is greater than any level $2^x$ (4N − 3) and less than the next higher level $2^x$ (4N − 1), where x is an integer 0, 1, 2, .... *n* designating a particular bit position in the output binary Gray code.

On the other hand, when analog-to-straight binary code conversion is desired, the output signals from the threshold detector circuits are combined to produce straight binary output bit in accordance with the following logical pattern or algorithm.

a. a binary output bit is produced in the $2^0$ bit position whenever the analog input signal amplitude is greater than any level 2N − 1 and less than the next higher level 2N;

b. a binary output bit is produced in the $2^1$ bit position whenever the analog input signal amplitude is greater than any level 2 (2N − 1) and less than the next higher level 2 (2N);

c. a binary output bit is produced in the $2^2$ bit position whenever the analog input signal is greater than any level 4 (2N − 1) and less than the next higher level 4 (2N); and, d. a binary output bit is produced in the $2^n$ bit position whenever the analog input signal is greater than any level $2^n$ (2N − 1) and less than the next higher level $2^n$ (2N).

Stated in more general terms, a straight binary output code bit is produced in any arbitrary bit position $2^x$ when the analog input is greater than any level $2^x$ (2N − 1) and less than the next higher level $2^x$ (2N).

If a comparison is now made between the foregoing general statements concerning the production of an output bit in any arbitrary bit position for both straight binary and binary Gray code conversion, it will be noted that these statements can be generalized still further for both types of output code and expressed as the following general algorithm:

A binary output bit is produced in any output bit position, $2^x$, if the analog input is greater than any level $2^x[K(2N-1)-C]$ and less than the next higher level $2^x[K(2N)-C]$, where K = 1 and C = 0 for analog-to-straight binary conversion, and K = 2 and C = 1 for analog-to-binary Gray code conversion.

For convenience, the following table contains a listing of the straight binary and binary Gray code outputs capable of being produced by a 4-bit embodiment of the proposed converter:

| Decimal Number | Threshold Level | Straight Binary | Gray Code |
|---|---|---|---|
| 0 | — | 0000 | 0000 |
| 1 | $L_1$ | 0001 | 0001 |
| 2 | $L_2$ | 0010 | 0011 |
| 3 | $L_3$ | 0011 | 0010 |
| 4 | $L_4$ | 0100 | 0110 |
| 5 | $L_5$ | 0101 | 0111 |
| 6 | $L_6$ | 0110 | 0101 |
| 7 | $L_7$ | 0111 | 0100 |
| 8 | $L_8$ | 1000 | 1100 |
| 9 | $L_9$ | 1001 | 1101 |
| 10 | $L_{10}$ | 1010 | 1111 |
| 11 | $L_{11}$ | 1011 | 1110 |
| 12 | $L_{12}$ | 1100 | 1010 |
| 13 | $L_{13}$ | 1101 | 1011 |
| 14 | $L_{14}$ | 1110 | 1001 |
| 15 | $L_{15}$ | 111 | 1000 |

Referring now to FIG. 1 of the drawings, the basic unit for performing the threshold detection and logic gating employed in the proposed analog-to-digital conversion method and apparatus of the present invention is illustrated. The analog input signal is applied on input line 10 to circuitry generally designated at 11 which functions to detect the amplitude of the input analog signal relative to the predetermined limits set by the lower threshold signal designated at 12 and the upper threshold level designated at input 13.

Functionally, the comparison of the analog input signal against these threshold levels 12 and 13 is accomplished by amplitude comparators 14 and 15 and the associated logical gating stage 16 which receives an INHIBIT signal from the comparator 15 when the analog input 10 exceeds the upper threshold 13 so as to prevent the output signal from comparator 14 from being applied as input to the illustrated OR gate 17. In other words, when the analog input signal 10 lies between the threshold levels 12 and 13, the gate 16 is open and a first signal level (e.g., representing a binary "1") appears at the output of OR gate 17; whereas, when the analog input signal exceeds level 13, the gate is inhibited or closed and a second signal level (e.g., representing a binary "0") appears at the output of OR gate 17.

As will be described in more detail hereinafter, a plurality of basic units 11 of FIG. 1 would be utilized to convert an analog input signal into a multi-bit output digital Gray code, with the exact number of basic detector units required being dependent upon the number of bit positions contained in the desired output code. The detection of the analog signal relative to all threshold detection levels associated with this plurality of basic units 11 would then be performed simultaneously, in accordance with the present invention. This reduces significantly the amount of time necessary to perform the analog-to-digital conversion process. Moreover, very simple transistor circuitry with a minimum number of circuit components can readily be utilized as each basic unit 11 to perform the threshold detection/inhibit gating which determines whether the input analog signal lies between the associated pair of predetermined threshold limits. The output signal levels produced by each of these basic detection/inhibit gating units 11 are then combined in an OR date 17 for each significant bit in the converter. As will become more clear hereinafter, the novel gating method proposed in accordance with the present invention is especially suitable for producing a binary Gray code output inasmuch as such code changes only one bit at a time. Accordingly, the digital output can be read on the "fly" and the error will only be in the least significant bit.

Such gating requires that the output of two level detector circuits be combined in a gate circuit and that the outputs from many of these gating circuits be applied to an OR gate to form the binary output for a particular bit weight or bit position.

Figure 2:
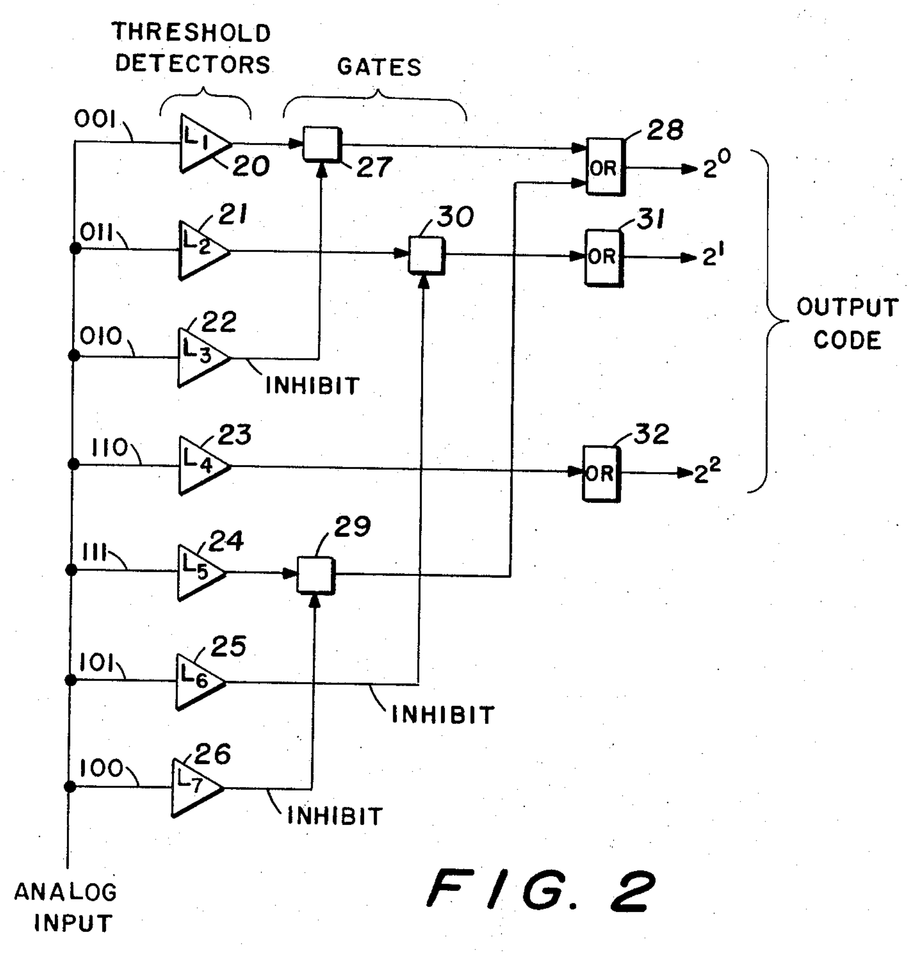
FIG. 2 is a block diagram of a 3-bit simultaneous analog-to-digital binary Gray code converter embodying the present invention.

A more thorough understanding of the proposed method and apparatus of the present invention may be obtained by reference to the diagram of FIG. 2 which illustrates the apparatus necessary to convert an analog input signal into a 3-bit binary digital Gray code output. In accordance with the general code conversion algorithm noted above, it will be observed in FIG. 2 that for this 3-bit converter, there are seven discrete non-zero levels of analog input signal to be detected by the illustrated seven threshold detector units 20, 21, 22, 23, 24, 25 and 26. The corresponding Gray code output associated with each of these seven discrete non-zero levels of the analog input signal is indicated to the left of each of the threshold detectors 20 through 26. It should be noted here that the comparator or threshold level detector having the smallest (lowest amplitude) threshold level is at the top of FIG. 2 and that the thresholds increase progressively towards the bottom of this figure.

In accordance with the present invention, the output signal from threshold detector 20 associated with the first ($N = 1$, so that $4N - 3 = 1$) or lowest non-zero analog input signal level ($L_1$) to be detected is applied as one input to a gate circuit 27 which also receives its second or inhibiting signal from the output of the third level (with $N = 1$, $4N - 1 = 3$) threshold detector or comparator 22. As a result, the output signal from comparator 20 is able to pass through the gate 27 and to the OR gate 28, and thereby cause an output bit in the associated $2^0$ bit position of the illustrated multiple line output code, as long as the amplitude of the analog input signal lies between the first and third predetermined threshold levels ($L_1$ and $L_3$) associated with the comparators 20 and 22 respectively. As noted earlier, a second input to the OR gate 28 is applied from the output of the gate 29 which receives one input from the fifth level (with $N = 2$, $4N - 3 = 5$) detector unit 24 and an inhibiting signal from the threshold detector 26 associated with the seventh (with $N = 2$, $4N - 1 = 7$) discrete input signal level ($L_7$). Accordingly, an output binary bit will also be generated in the $2^0$ bit position if the analog input signal magnitude is between the threshold levels associated with comparators 24 and 26, even though the gate 27 is then being inhibited by the output from comparator 22.

With respect to the $2^1$ bit position of the output code, the output from the threshold detector 21 associated with the second non-zero level ($L_2$) of the analog input signal (with $N = 1$, $2(4N - 3) = 2$) is applied to a gate 30 along with an inhibiting control signal from the threshold detector 25. In accordance with the logic algorithm discussed hereinabove, this inhibiting signal is present if the input analog signal exceeds the sixth (with $N = 1$, $2(4N - 1) = 6$) threshold level ($L_6$). Thus, the gate 30 will produce an output signal effective to open the OR gate 31 (shown only to maintain conformity with the $2^0$ bit position) and produce an output bit in the $2^1$ bit position of the output code so long as the analog input signal amplitude is between the second and sixth threshold levels associated with comparators 21 and 25 respectively.

In the 3 -bit code embodiment shown in FIG. 2, it will be noted that the threshold detector 23 and the connected OR gate 32 (also shown merely to maintain conformity) associated with the $2^2$ bit position of the output code do not have an intervening gate circuit associated therewith, inasmuch as all higher levels of analog input signal to be detected in this embodiment should also be represented by a binary output bit in the $2^2$ bit position of the output code. As shown in FIG. 2 and pursuant to the logic algorithm discussed above, the detector 23 is associated with the fourth (with $N = 1$, $4(4N-3) = 4$) discrete analog input signal level ($L_4$) to be detected.

Figure 3:
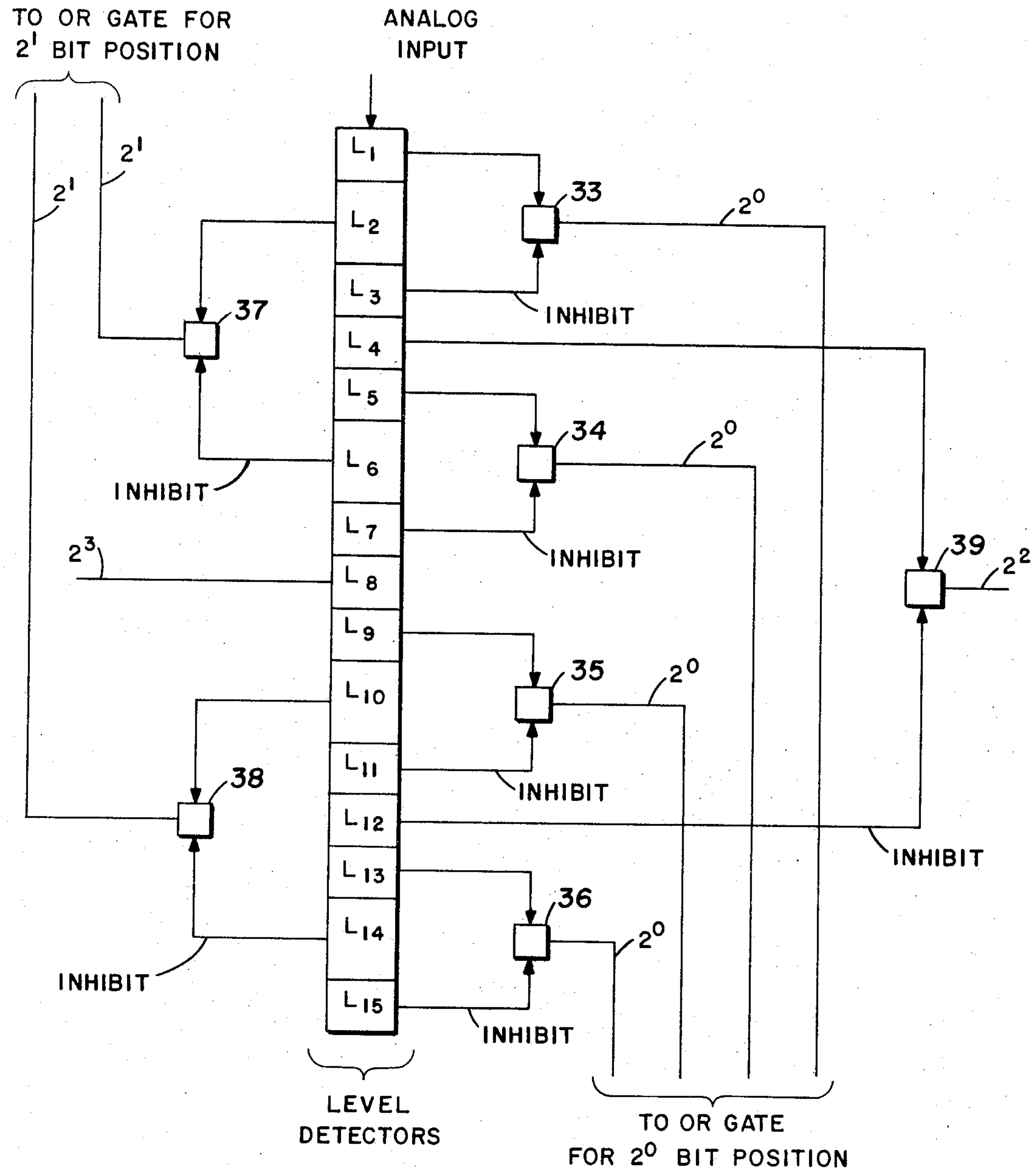
FIG. 3 is a logic diagram of a 4-bit simultaneous analog-to-digital binary Gray code converter embodying the present invention.

It will readily be apparent to those skilled in the art that the proposed A/D conversion method and apparatus can be expanded, as desired, to produce any desired length or *n*-bit output digital Gray code. In FIG. 3 of the drawings, a 4-bit implementation of an analog-to-binary Gray code conversion method and apparatus embodying the present invention is illustrated, and each of the 15 blocks shown at the center of FIG. 3 represents a properly biased level detector (e.g., see 20 through 26 in FIG. 2) associated with each of the 15 discrete non-zero levels ($L_1$ through $L_{15}$) of analog input signal to be sensed in this 4-bit embodiment. More specifically and in accordance with the general logic algorithm discussed hereinabove, the outputs from the first and third, fifth and seventh, ninth and eleventh, and thirteenth and fifteenth level detectors are combined, as pairs, in the gate circuits 33, 34, 35, and 36 respectively, and the output from these four gate circuits would be connected to an OR gate (not shown) to produce an output binary bit in the $2^0$ bit position. Similarly, the output signals from the second and sixth, and tenth and fourteenth level detectors are combined in gate circuits 37 and 38 respectively to control production of an output binary bit in the $2^1$ bit position. The fourth and twelveth level detector outputs would be combined in the gate 39 to produce a binary output bit in the $2^2$ bit position; whereas, the middle or eighth level detector output would be utilized to generate an output binary bit in the $2^3$ bit position.

As noted earlier, one advantage of the present invention is that analog-to-digital code conversion is accomplished very rapidly by reducing the number of serially connected circuit stages or elements required in the conversion process. Moreover, the conversion circuitry should be kept as simple as possible so as to render it suitable for microelectronic fabrication and thereby assure small size and reasonable cost. In this regard, while separate threshold detection circuits and inhibit gate circuits have been assumed in the foregoing description, it should be understood at this time that, in accordance with the proposed analog-to-digital conversion method and apparatus of the present invention, the lower and upper threshold decisions, as well as the inhibit gating, can readily be performed by a single, combined circuit.

Figure 4:
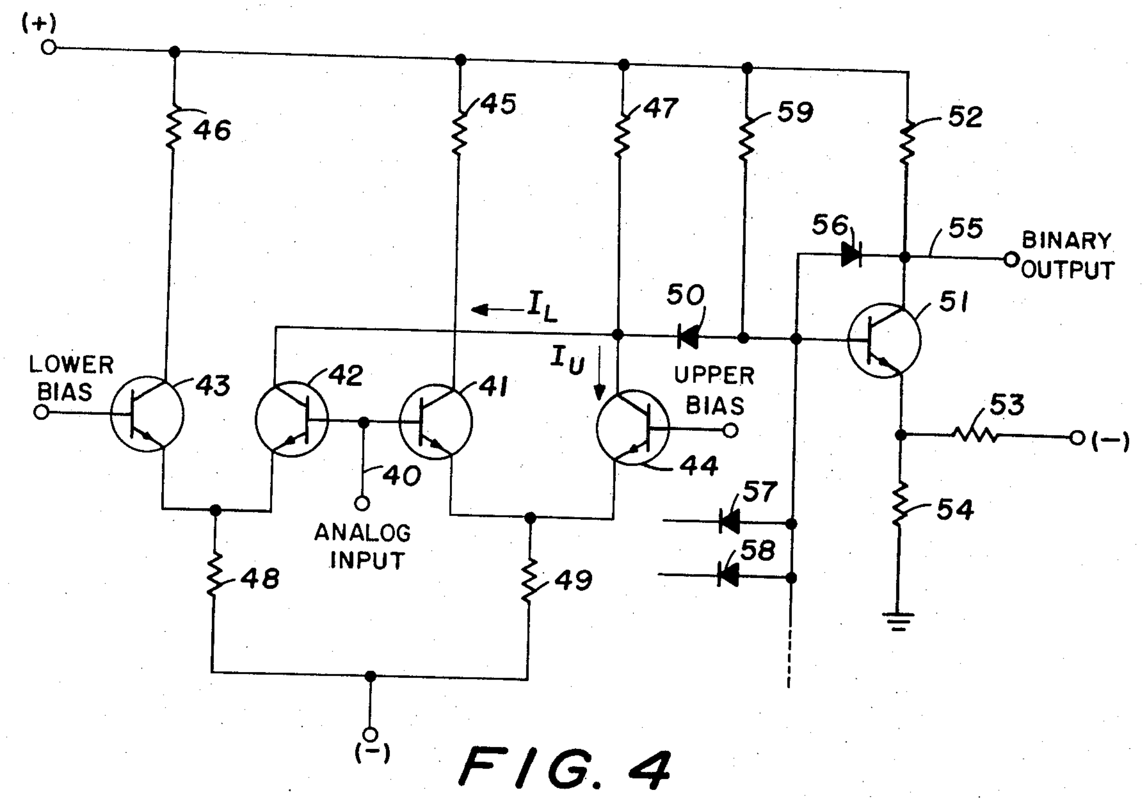
FIG. 4 illustrates detailed circuitry proposed in accordance with the present invention for performing the threshold detection/logical gating employed in the analog-to-Gray code converter embodiments of the present invention.

One form of circuitry particularly suited to perform the combined threshold level detection/inhibit gating attributed, for example, to basic unit 11 of FIG. 1 in accordance with the analog-to-Gray code embodiment of the present invention is illustrated in FIG. 4 of the drawings. This combined circuitry basically comprises two differential transistor pairs each associated with a different threshold level for the input analog signal. More specifically, the analog signal is applied at input line 40 to the bases of transistor stages 41 and 42. The transistor 42, together with transistor 43, forms a conventional differential pair; whereas, transistor 41 and transistor 44 form a similar second differential pair. The bases of transistors 43 and 44 are connected to designated LOWER and UPPER bias voltages respectively which define the lower and upper threshold levels against which the analog input signal 40 is to be compared by the transistor pairs 42–43 and 41–44 respectively. The respective collectors of transistors 41 and 43 are connected to positive supply voltage through resistors 45 and 46; whereas, the collectors of the other transistors 42 and 44 of each pair are tied together and connected to this same positive supply voltage through common resistor 47. The emitters of transistor pair 42–43 are connected to a negative supply voltage through common resistor 48 and the emitters of transistor pair 41–44 are connected to the negative supply voltage through common resistor 49.

The collectors of transistors 42 and 44 are also connected, through diode 50, to the base of an output transistor stage 51. Proper biasing voltage for the emitter of transistor 51 is derived from the junction of resistors 53 and 54 connected between the negative supply voltage and ground; whereas, the collector of output transistor 51 is connected to the positive supply voltage through resistor 52. The typical binary output bit 55 produced for each bit position appears at the collector of the output transistor stage 51, as illustrated. The Schottky diode 56 prevents saturation of the output transistor.

Figure 5:
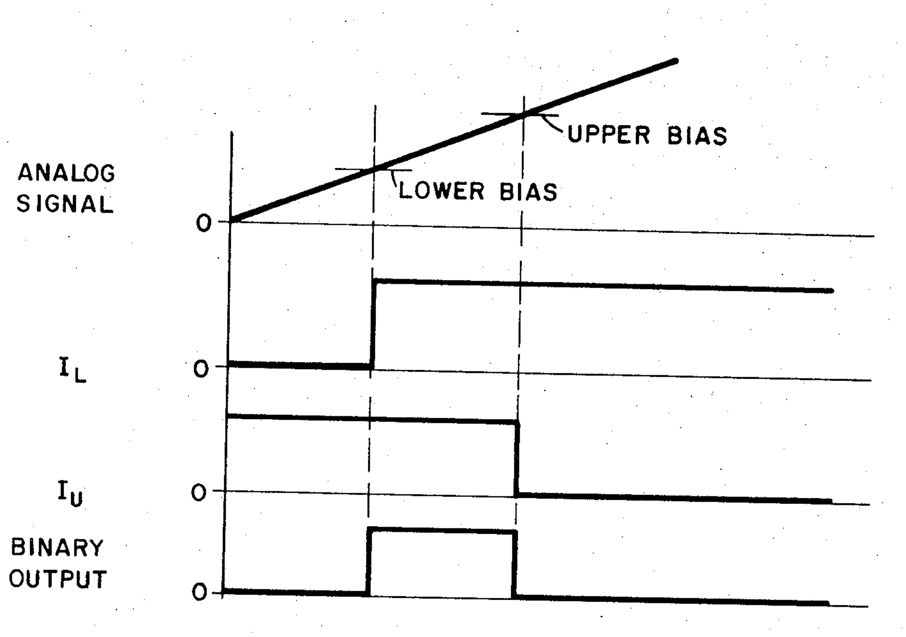
FIG. 5 is a waveform diagram useful in explaining the operation of the detailed circuitry of FIG. 4.

During operation, the transistors 43 and 44 of the transistor pairs 42–43 and 41–44 are normally conducting. However, when the analog input signal at 40 exceeds the lower threshold level defined by the illustrated LOWER bias voltage applied at the base of transistor 43, current designated at $I_L$ in FIG. 4 begins to flow into the collector of transistor stage 42 and, in accordance with well-known differential pair operation, causes cut-off of the transistor stage 43 (see waveform diagram of FIG. 5). This conduction at transistor stage 42, occurring concurrently with conduction at transistor stage 44, causes the voltage level at the left-hand side of the diode 50 to be sufficiently low to forward bias the diode 50 and thereby cause cut-off of the output transistor stage 51. As a result, a binary output level is produced (see FIG. 5) and represents a binary bit occurring in the corresponding bit position.

On the other hand, if the analog input signal at 40 should increase sufficiently so that it now exceeds the upper threshold level set by the illustrated UPPER bias being applied to the base of transistor stage 44, the resulting increased conduction of transistor stage 41 will cause cut-off of transistor stage 44 and thereby terminate the flow of collector current $I_U$ in the transistor stage 44. Consequently, the voltage at the left-hand side of the diode 50 will rise sufficiently to turn on the output transistor stage 51 and thereby terminate the binary output bit at 55.

In view of the foregoing discussion it will be obvious that the circuitry of FIG. 4 performs the desired threshold detection/inhibit gating functions; that is, an output binary bit is generated provided the analog input signal is between the upper and lower threshold levels defined by the biasing voltages being applied to the bases of transistors 43 and 44 respectively, and the binary output bit generation is inhibited when the upper threshold level is exceeded. This form of circuitry can thus be utilized to perform the functions of elements 14, 15 and 16 comprising the basic unit 11 of FIG. 1.

The desired OR gating of the output signals or signal levels from the gates associated with a given bit of the output code (e.g., see OR gate 28 connected to gates 27 and 29 in FIG. 2) can readily be provided by merely connecting each output from a gate through a suitable diode, such as 57 or 58, in FIG. 4, to the output stage 51 associated with the same bit position. Pull-up resistor 59 causes the output transistor 51 to conduct whenever all of the output signals are inhibited.

A person of ordinary skill in this art will readily appreciate that the illustrated circuitry of FIG. 4 is able to perform the desired threshold detection/inhibit gating/OR gating with a relatively low circuit parts count. This facilitates miniaturization of the proposed converter. In addition, each of the illustrated differential transistor pairs utilized for detecting the magnitude of the input signal relative to a predetermined threshold level can readily be made by microelectronic fabrication techniques to provide well balanced pairs of transistors with tight thermocoupling so that the threshold levels will remain substantially stable. The shorter leads possible with microelectronic circuits will also tend to reduce capacitance loading and thereby increase the switching speed slightly beyond that possible with other forms of circuit fabrication.

Figure 6:
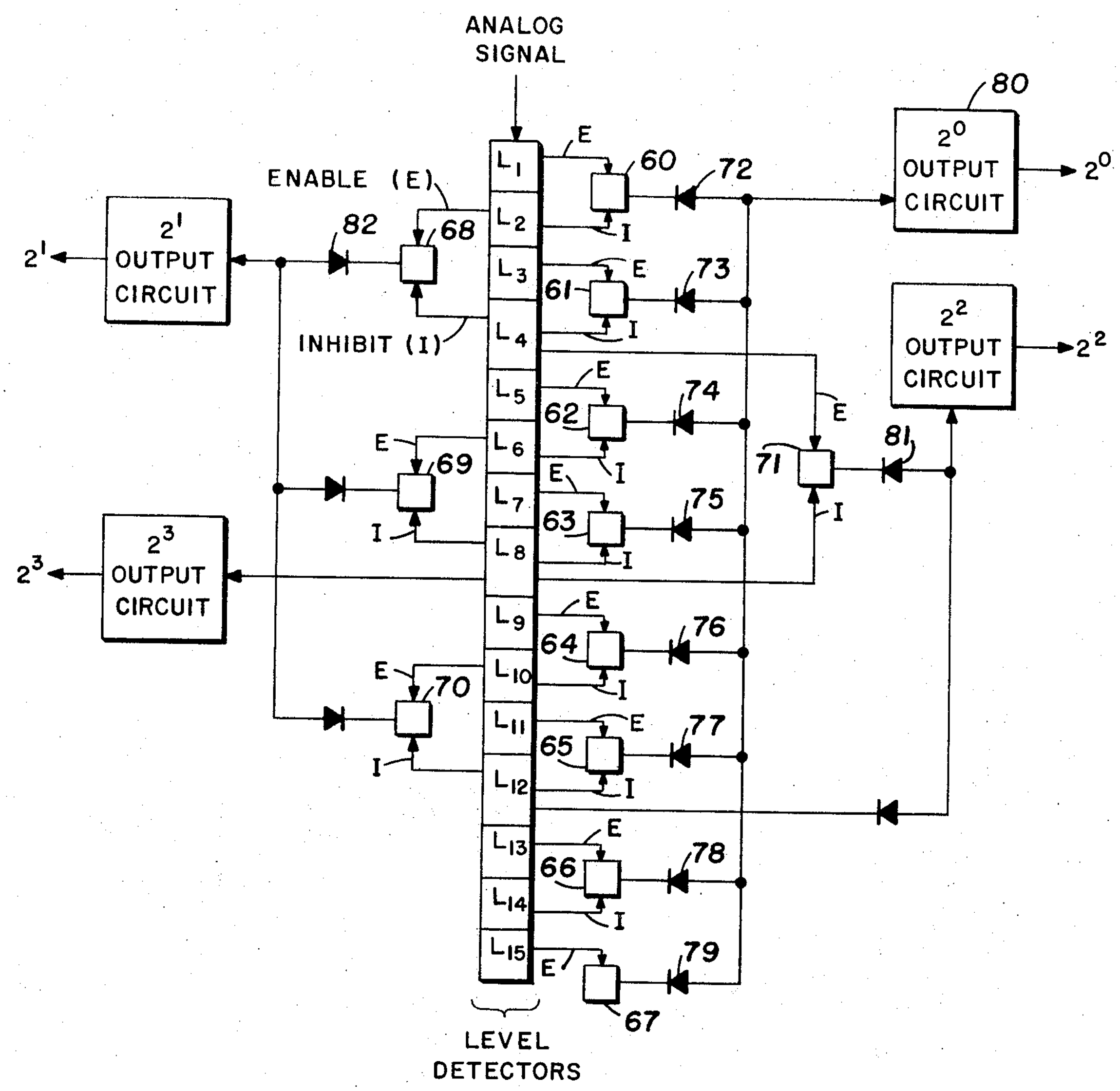
FIG. 6 is a logic diagram of a 4-bit simultaneous analog-to-straight binary code converter embodying the present invention.

Referring now to FIG. 6 of the drawings and the logic diagram of a 4-bit analog-to-straight binary embodiment of the present invention, the fifteen (15) illustrated level detectors are here again employed to simultaneously compare the analog input signal against the associated threshold levels $L_1$ through $L_{15}$. The output signals from these level detectors are then combined, at gates 60 through 71, in accordance with the general logic algorithm stated hereinabove, to wit:

A binary output bit is produced in any output bit position, $2^x$, if the analog input is greater than any level $2^x[K(2N-1)-C]$ and less than the next higher level $2^x[K(2N)-C]$, where $K=1$ and $C=0$ for conversion to straight binary code form.

As shown in FIG. 6, the necessary logical OR gating of the outputs from the gates 60 through 67, for the $2^0$ bit position, is performed by the associated diodes 72 through 79 respectively which are connected to a common line input to an $2^0$ output circuit designated at 80. Similarly, diodes are also employed to perform OR gating, as appropriate, at the inputs to the other illustrated output circuits for the $2^1$ and $2^2$ bit positions.

It should be noted in FIG. 6 that the threshold level detectors associated with the odd numbered threshold levels $L_1$, $L_3$, $L_5$, $L_7$, $L_9$, $L_{11}$, $L_{13}$ and $L_{15}$ produce only a single output which is used as the enabling signal for the associated gates 60 through 67; whereas, all of the even numbered level detectors (except that associated with level $L_{14}$) produce multiple outputs which can be used as either enabling or inhibiting signals for the illustrated gates. More specifically, an output from an even numbered level detector (e.g., $L_2$, $L_4$, etc.) is always used as an inhibiting signal for the $2^0$ bit position, but for the higher order binary bit positions ($2^1$ and above), the output from the even numbered detector (e.g., see $L_4$) can serve as an enabling and/or inhibiting function. Inasmuch as the outputs from a given level detector must serve these multiple (enabling/inhibiting) functions, the outputs must be properly isolated or buffered relative to one another, as will be described shortly.

Figure 7:
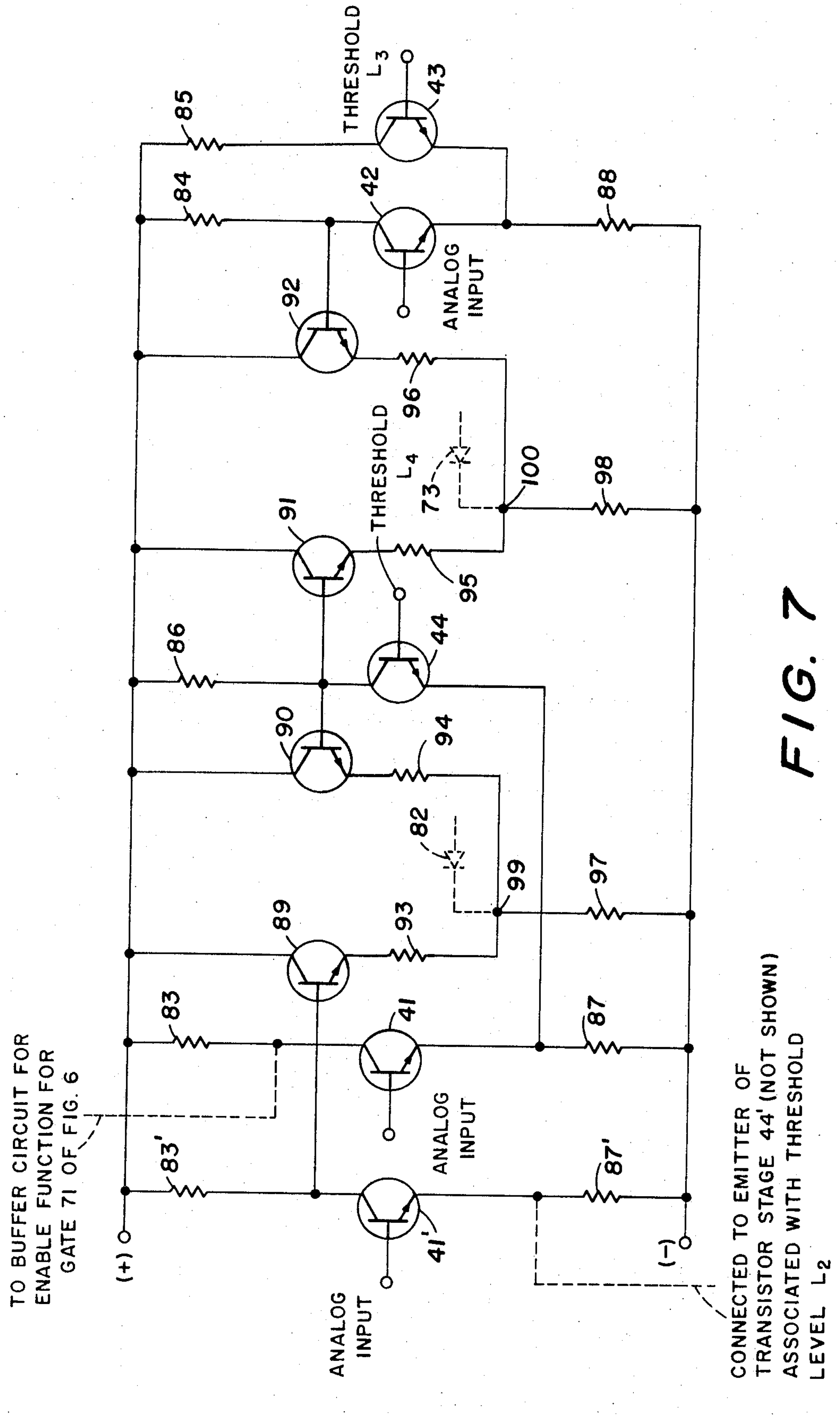
FIG. 7 illustrates detailed circuitry capable of performing the threshold detection/logical gating employed in the analog-to-straight binary converter embodiment of FIG. 6.

One form of detailed circuitry proposed in accordance with the present invention to perform the combined threshold detection/inhibit gating/OR gating functions, during analog-to-straight binary code conversion, is illustrated in FIG. 7 of the drawings and is similar in many respects to the detailed circuitry shown in FIG. 4. For explanation purposes only, the detailed circuit illustration of FIG. 7 contains reference designations associated with the level detectors for levels $L_2$, $L_3$, and $L_4$, gates 61, 68 and 71, and OR gating diodes 73, 81 and 82 (see FIG. 6).

More particularly, conventional differential transistors pairs 41–42 and 42–43 are again employed as level detectors which simultaneously compare the analog input signal against the fifteen discrete threshold levels $L_1$ through $L_{15}$. The collectors of transistors 41 through 44 are connected to positive supply voltage through resistors 83 through 86 respectively; the emitters of pair 41–44 and pair 42–43 are connected to negative supply voltage through common resistors 87 and 88 respectively; the bases of transistors 41 and 42 receive the analog input; and, the bases of transistors 43 and 44 are connected to preselected biasing voltages defining (in FIG. 7) threshold levels $L_3$ and $L_4$ respectively.

As mentioned previously, the output signals from the level detectors associated with the odd numbered threshold levels $L_1$, $L_3$, $L_5$, etc., are used only as enabling inputs to the gates 60 through 67 for the $2^0$ bit position.

Further, the voltage from the collector of each transistor 43 of each pair 42–43 is not used elsewhere and therefore does not need to be isolated. On the other hand, since the output signals from transistors 41, 42, and 44 are combined or summed with the output signals from other level detector stages to provide enabling or inhibiting functions, each of the output signals produced (at the collectors) by the transistors 41, 42, and 44 must be isolated prior to combining or summing it with the output of another level detector stage.

Thus, in FIG. 7, the outputs (collectors) of the illustrated transistor stages 41, 42 and 44 are all connected to the bases of associated isolation transistor stages 89, 90, 91 and 92 whose respective collectors are connected directly to the positive supply voltage and whose emitters are connected to the negative supply voltage through separate emitter resistors 93, 94, 95 and 96 and common pulldown resistors 97 and 98. In this typical circuitry, combining or summing nodes 99 and 100 at the top of common resistors 97 and 98 respectively are connected, as shown in dotted form, to the cathode or left-hand side of the OR gate diodes 82 and 73 respectively. As shown in FIG. 6, the right-hand sides of the diodes 82 and 73 are connected to the $2^1$ and $2^0$ output circuits respectively of the type illustrated in FIG. 4.

In order to describe the operation of the circuitry shown in FIG. 7, it will be assumed initially that the analog input is less than the lowest threshold level $L_1$. Therefore, the transistors 43 and 44 of each illustrated pair 41–44 and 42–43 are normally conducting, indicating that the analog input signal is less than the associated threshold levels $L_3$ and $L_4$. As a result of the conduction at stage 44, the isolation transistor stages 90 and 91 are cut-off. However, inasmuch as transistor stages 41 and 42 are also cut-off and thereby render conductive the associated isolation stages 89 and 92, the voltage level at each of the illustrated summing nodes 99 and 100 is too high to cause the associated $2^1$ and $2^0$ output circuits to generate a binary output bit (refer to FIG. 4 and description associated with typical output circuit).

It will be recalled from the description of the basic level detector circuitry of FIG. 4 that the inhibiting function (e.g., as shown diagrammatically by the reference letter I leading to the underside of block 60 in FIG. 6) is derived from the collector of transistor stage 44 when this stage is rendered non-conductive by reason of the analog input exceeding the associated upper threshold level. In the circuitry of FIG. 7, this same inhibiting function is again derived at the collector of transistor stage 44. On the other hand, the enabling functions may or may not be derived in FIG. 7 from the same circuit point (collector of transistor stage 42) as used in the typical circuitry of FIG. 4. More specifically, for the odd numbered threshold levels associated with only the $2^0$ bit position, the enabling function is again derived at the collector of stage 42 when this stage is rendered conductive and stage 43 is cut-off due to the analog input (applied to the base of stage 42) exceeding the threshold level $L_3$, for example. In other words, when the analog input exceeds the threshold level $L_3$ but is still less than threshold level $L_4$, both of the isolation stages 91 and 92 associated with differential pair stages 44 and 42 respectively are almost cut-off and the voltage level at the combining or summing node 100 is sufficiently low to forward bias diode 73 and thereby cause the generation of an output bit in the $2^0$ bit position. When the analog input exceeds the upper threshold level $L_4$, stage 44 is turned off and isolation stage 91 turns on. This again raises the voltage level at node 100 and terminates the binary output bit.

Referring now to FIG. 6 and the gate 68 associated with the $2^1$ bit position, it will be noted that the enabling function is derived from the $L_2$ threshold level detector and that the inhibiting function is derived from the $L_4$ threshold detector. As shown in the detail circuitry of FIG. 7, this enabling function required when the analog input exceeds the $L_2$ threshold level is obtained at the collector of transistor stage 41' which is connected in the above-described differential pair configuration with an associated transistor stage 44' (not shown) to whose base is applied the bias voltage defining the threshold level $L_2$. Thus, when the analog input at the base of transistor stage 41' exceeds the threshold level $L_2$, stage 41' conducts and thereby tends to cut-off the associated isolation stage 89. Assuming that the analog input does not also exceed the threshold $L_4$ defined by the bias at the base of stage 44, the voltage level at summing node 99 is sufficiently low to forward bias the diode 82 and cause an output binary bit to appear in the $2^1$ bit position.

From the foregoing discussion it should be readily apparent that the proposed analog-to-digital conversion method of the present invention can be employed to convert an analog input into either a binary Gray or straight binary output digital code. Moreover, the invention is general in nature and is in no way limited in its application to electrical signals and electronic circuitry of the type shown in FIGS. 4 and/or 7 of the drawings. For example, the proposed A/D conversion technique could find application in the processing of optical or fluidic type signals, if desired.

Various other modifications, adaptations and alterations of the present invention are of course possible in the light of the above teachings. It should therefore be understood at this time that within the scope of the appended claims the invention may be practiced otherwise than as specifically described hereinabove.

What is claimed is:

1. Apparatus for converting an analog input signal into multiple bit binary digital output code and comprising circuitry for comparing said analog input signal relative to upper and lower threshold signal levels associated with a predetermined bit position in the output digital code, said circuitry comprising, first and second differential transistor pairs each having first and second transistor stages including base, collector and emitter elements, the base of one of said transistors of each pair being connected to said analog input signal, the base of the other transistor in said first pair being connected to a first biasing voltage defining said lower threshold signal level and the base of the other transistor in said second pair being connected to a second biasing voltage defining said upper threshold signal level, the emitters of the transistors in each pair being connected together, the collector of said one transistor of said first pair being connected to a common junction with the collector of said other transistor of said second pair, an output transistor stage having base, emitter and collector elements, said output transistor stage being effective depending upon its collector-emitter conduction state of producing a signal representing a binary output bit, and a diode interconnecting the base of said output transistor stage to the common junction of the collectors of said one transistor of said first pair and said other transistor of said second pair, said diode becoming biased to change the conduction state of said output transistor stage when the analog input signal is greater than the lower signal level defined by said first biasing voltage and less than the upper signal level defined by said second signal level.

2. An analog-to-digital conversion apparatus wherein there is one first and one second differential transistor pair for detecting the value of an analog input signal relative to an associated pair of upper and lower threshold levels and wherein each of said first and second differential transistor pairs comprises first and second transistor stages having base, collector and emitter elements, the base of one of said transistors of each pair being connected to said analog input signal, the base of the other transistor in said first pair being connected to a first biasing voltage defining said lower threshold signal level and the base of the other transistor in said second pair being connected to a second biasing voltage defining said upper threshold signal level, the emitters of the transistors in each pair being connected together, first isolation circuit means connecting the collector of said one transistor of said first pair and the collector of said other transistor of said second pair to a first common junction, second isolation circuit means connecting the collector of said other transistor of said second pair and the collector of said one transistor of any other transistor pair having an associated threshold level to a second common junction, first and second output transistor stages associated with different binary output bit positions and each having a base, emitter and collector elements and each being effective depending upon its collector-emitter conduction state of producing a signal representing a binary output bit in the associated bit position, and first and second diode interconnecting the bases of each of said first and second output transistor stages to said first and second common junctions respectively, each of said first and second diodes becoming biased to change the conduction state of said first and second output transistor stages respectively to be such that a binary output bit occurs only when the analog input signal lies between the associated pair of upper and lower threshold levels.

* * * * *